United States Patent [19]

Martin

[11] Patent Number: 5,495,187
[45] Date of Patent: Feb. 27, 1996

[54] CMOS INPUT WITH VCC COMPENSATED DYNAMIC THRESHOLD

[75] Inventor: Brian Martin, Albuquerque, N.M.

[73] Assignee: Philips Electronics North America Corporation, New York, N.Y.

[21] Appl. No.: 489,242

[22] Filed: Jun. 12, 1995

Related U.S. Application Data

[63] Continuation of Ser. No. 218,481, Mar. 25, 1994, abandoned.

[51] Int. Cl.$^6$ .............................................. H03K 19/0948
[52] U.S. Cl. .................... 326/33; 326/24; 326/83
[58] Field of Search ...................... 307/451, 443, 307/475, 263; 326/33, 83, 22, 23, 24, 33, 83, 121

[56] References Cited

U.S. PATENT DOCUMENTS

| | | | |
|---|---|---|---|
| 4,477,741 | 10/1984 | Moser, Jr. | 307/473 |
| 4,553,043 | 11/1985 | Parker | 307/443 |
| 4,929,853 | 5/1990 | Kim et al. | 307/451 |
| 4,933,574 | 6/1990 | Lien et al. | 307/446 |
| 4,958,089 | 9/1990 | Fitzpatrick et al. | 307/443 |
| 4,999,529 | 3/1991 | Morgan, Jr. et al. | 307/451 |
| 5,073,727 | 12/1991 | Shizu | 307/451 |
| 5,128,555 | 7/1992 | Millman | 307/443 |
| 5,140,195 | 8/1992 | Wakayama | 307/451 |
| 5,258,665 | 11/1993 | Ward et al. | 307/446 |
| 5,341,045 | 8/1994 | Almulla | 307/451 |

FOREIGN PATENT DOCUMENTS

| | | |
|---|---|---|
| 58-59628 | 4/1983 | Japan . |
| 14152 | 2/1989 | Japan . |
| 2161817 | 6/1990 | Japan . |
| 529910 | 2/1993 | Japan . |

*Primary Examiner*—Edward P. Westin
*Assistant Examiner*—Benjamin D. Driscoll
*Attorney, Agent, or Firm*—David Schreiber

[57] ABSTRACT

A CMOS inverter circuit is provided which includes a compensation circuit which modifies the input threshold of the inverter depending on changes in the supply voltage. The inverter includes a standard CMOS inverter, current boosting circuitry and a further inverter. The input of the inverter is coupled to the current boosting circuitry and the input of the further inverter. The current boosting circuitry is also coupled to one of the supply voltages. The current boosting circuitry is operative to effectively change the PMOS to NMOS ratio of the inverter to maintain a substantially constant input threshold to counter the effect of any change in supply voltage.

8 Claims, 2 Drawing Sheets

CMOS INPUT WITH VCC COMPENSATED DYNAMIC THRESHOLD

This is a continuation of application Ser. No. 08/218,481, filed Mar. 25, 1994, abandoned.

CROSS-REFERENCE TO RELATED APPLICATIONS

A commonly owned, copending application entitled "CMOS INPUT WITH TEMPERATURE AND $V_{CC}$ COMPENSATED THRESHOLD".

BACKGROUND OF THE INVENTION

This invention relates to a CMOS inverter circuit and more particularly to a CMOS inverter including a compensation circuit which compensates the inverter's low-to-high or high-to-low dynamic input threshold for a range of Vcc.

A conventional CMOS inverter 10 is shown in FIG. 1. Inverter 10 includes a pMOS transistor 12 and a nMOS transistor 14. A gate 12g of pMOS transistor 12 is coupled to a gate 14g of nMOS transistor 14. A first flow electrode 12s of transistor 12 is coupled to VCC and a first flow electrode 14s of transistor 14 is coupled to ground. A second flow electrode 12d of transistor 12 is coupled to a second flow electrode 14d of transistor 14. The switching threshold of inverter 10 is dependent on the relative size of transistors 12 and 14 and the supply voltage Vcc. The higher the ratio of pMOS to nMOS, the higher the input threshold. If we assume for a typical circuit that the input threshold is Vcc/2 and that Vcc is allowed to vary from 2.7 to 3.6 volts, the input threshold could then vary from 1.35 to 1.8 volts. This is undesirable, for example, if the input of inverter 10 is a clock pulse specified to ramp from 2.7 to 0 volts with a 2.5 ns slew rate and the design requires the propagation time of the clock signal to be independent of Vcc.

Accordingly, it would be desirable to provide a CMOS inverter including circuitry which could control the switching threshold as Vcc varies in order to maintain a substantially constant input threshold.

SUMMARY OF THE INVENTION

It is thus an object of the invention to provide a CMOS inverter having compensation circuitry which is capable of compensating for an input signal having either a fast low-to-high or a high-to-low slew rate input threshold over a predetermined range of Vcc by maintaining the effective input threshold of the inverter at a substantially single voltage over a range of Vcc for relatively fast input edge rates by modifying the ratio of PMOS to NMOS as the supply voltage changes.

It is a further object of the invention to allow the effective input threshold to remain a percentage of Vcc and. thus change when Vcc changes for relatively slow input edge rates.

In accordance with the invention, these objects are achieved by a new CMOS inverter structure which includes a first inverter, a second inverter and current boosting circuitry. The second inverter and current boosting circuitry raise the input threshold or lower the input threshold of the first inverter so that the input threshold of the first inverter is substantially independent on changes in Vcc.

In a preferred embodiment, the current boosting circuitry includes two pMOS transistors. The first transistor of the current booster has its control electrode coupled to the output of the second inverter, its first flow electrode coupled to Vcc and it second flow electrode coupled to the first flow electrode of the second transistor. The second flow electrode of the second transistor is coupled to the output terminal. Both the input of the second inverter and the control electrode of the second transistor are coupled to the input terminal of the inverter circuit. The input threshold of the second inverter must be greater than the input threshold of the first inverter.

In a further preferred embodiment of the inverter circuit the current boosting circuitry includes two nMOS transistors. The first transistor has its control electrode coupled to the output of the second inverter, it first flow electrode coupled to ground and its second flow electrode coupled to the first flow electrode of the second transistor. The second flow electrode of the second transistor is coupled to the output terminal of the inverter circuit. Both the input of the second inverter and the control electrode of the second transistor are coupled to the input terminal of the inverter circuit. The input threshold of the second inverter must be less than the input threshold of the first inverter.

Still other objects and advantages of the invention will in part be obvious and will in part be apparent from the specification.

The invention accordingly comprises the features of construction, combination of elements and arrangement of parts which will be exemplified in the construction hereinafter set forth, and the scope of the invention will be indicated in the claims.

BRIEF DESCRIPTION OF THE DRAWINGS

For a fuller understanding of the invention, reference is had to the following description taken in connection with the accompanying drawings, in which.

DETAILED DESCRIPTION OF THE PREFERRED EMBODIMENTS

Figure 1:
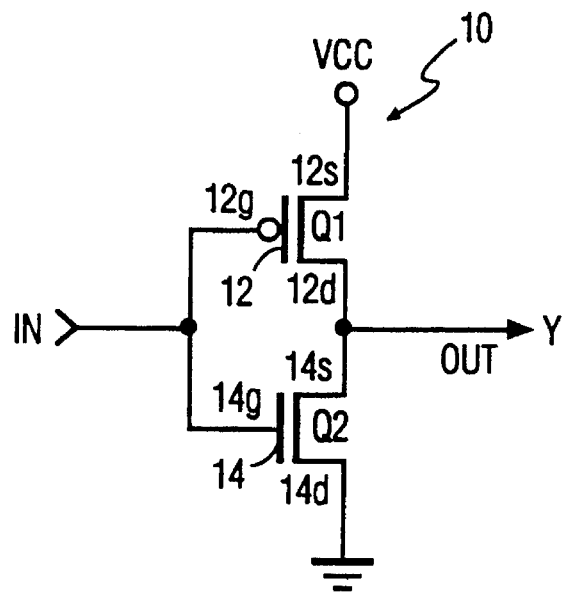
FIG. 1 is a circuit diagram of a CMOS inverter in accordance with the prior art.
Figure 2:
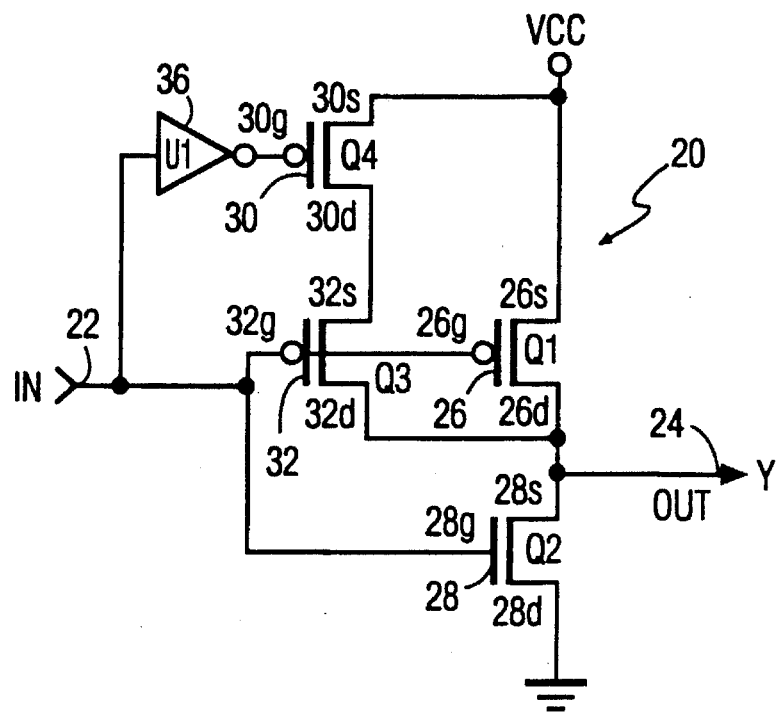
FIG. 2 is a circuit diagram of a CMOS inverter in accordance with a first embodiment of the present invention.

Reference is had to FIG. 2 which depicts a CMOS inverter in accordance with a first embodiment of the present invention. Inverter 20 is operable in the range from a voltage supply Vcc to ground and has an input terminal 22 and an output terminal 24. Inverter 20 includes a first pMOS transistor 26 and an nMOS transistor 28. PMOS transistor 26 has a gate 26g coupled to input terminal 22, a source 26s coupled to Vcc and a drain 26d. NMOS transistor 28 has a gate 28g coupled to gate 26g, a source 26s coupled to drain 26d and a drain 28d coupled to ground.

Inverter 20 also includes a second pMOS transistor 30 and a third pMOS transistor 32. Second pMOS transistor 30 includes a source 30s coupled to Vcc, a drain 30d and a gate 30g. Third pMOS transistor 32 includes a source 32s coupled to drain 30d, a drain 32d coupled to output terminal 24 and a gate 32g coupled to input terminal 22. A further inverter 36 having its input coupled to input terminal 22 and its output coupled to gate 30g is also included in inverter 20.

Transistors 26 and 28 should preferably be sized so that when forming a standard inverter 29 (consisting of transistors 26 and 28 without transistors 30 and 32 and further inverter 36) the high-to-low input threshold (the voltage at which the inverter switches) is approximately forty (40) percent of Vcc. The input threshold of further inverter 36 should preferably be set to approximately sixty (60) percent of Vcc. This relationship allows transistors 30 and 32 and further inverter 36 to raise the effective input threshold.

Circuit operation will be explained in accordance with the following example. Assume the input is specified to switch between 0 to 2.7 volts and Vcc is in the range from 2.7 to 3.6 volts. If Vcc equals 2.7 volts, the input thresholds of standard transistor 29 and further inverter 36 are approximately 1.1 and 1.6 volts respectively. Prior to a high-to-low transition, further inverter 36 holds gate 30g low, turning it on. Transistors 26 and 32 are off and transistor 28 is on, holding output terminal 24 to ground. At this point no current is flowing through the circuit. As the input voltage ramps down, transistors 26 and 32 begin to turn on and transistor 28 begins to turn off. The effective input threshold of inverter 20 is thus controlled by both by transistors 26 and 32 and is equal to approximately 1.4 volts. When the input voltage reaches 1.6 volts, further inverter 36 begins to switch, turning transistor 30 off. However, because of a propagation delay through further inverter 36, transistor 30 does not turn off instantly. Therefore if the input edge rate is fast enough so that the input voltage passes through 1.4 volts before transistor 30 has started to turn off, the voltage at output terminal 24 will begin to switch at 1.4 volts. As further inverter 36 turns transistor 30 off, the input voltage continues to drop past the 1.1 input threshold of standard transistor 29 so the voltage at output terminal 24 continues to switch. As can be seen by the above example, for a fast high-to-low input transition, the effective input threshold of inverter 20 would be approximately 1.4 volts.

If we now assume that Vcc equals 3.6 volts, the high-to-low input thresholds of standard inverter 29 and further inverter 36 would be 1.4 and 2.2 volts, respectively. If the same input signal is applied to inverter 20, further inverter 36 would begin to switch sooner relative to the voltage at output terminal 24 since the difference between the input thresholds increases as Vcc increases. Therefore, the contribution from transistor 32 to the effective input threshold of inverter 20 would be significantly less because transistor 30 would turn off sooner. As a result, the effective input threshold of inverter 20 would be approximately 1.5 volts. Thus, this embodiment of the invention creates a dynamic input threshold of inverter 20 which varies by only 0.1 volts over a Vcc range of 0.9 volts.

The embodiment of FIG. 2 does not affect the input threshold during a low-to-high transition. As the input voltage rises, the voltage passes through the input threshold of standard inverter 29 before further inverter 36 turns transistor 30 on. Therefore, transistors 30 and 32 have no function in determining the dynamic input threshold of inverter 20.

Figure 3:
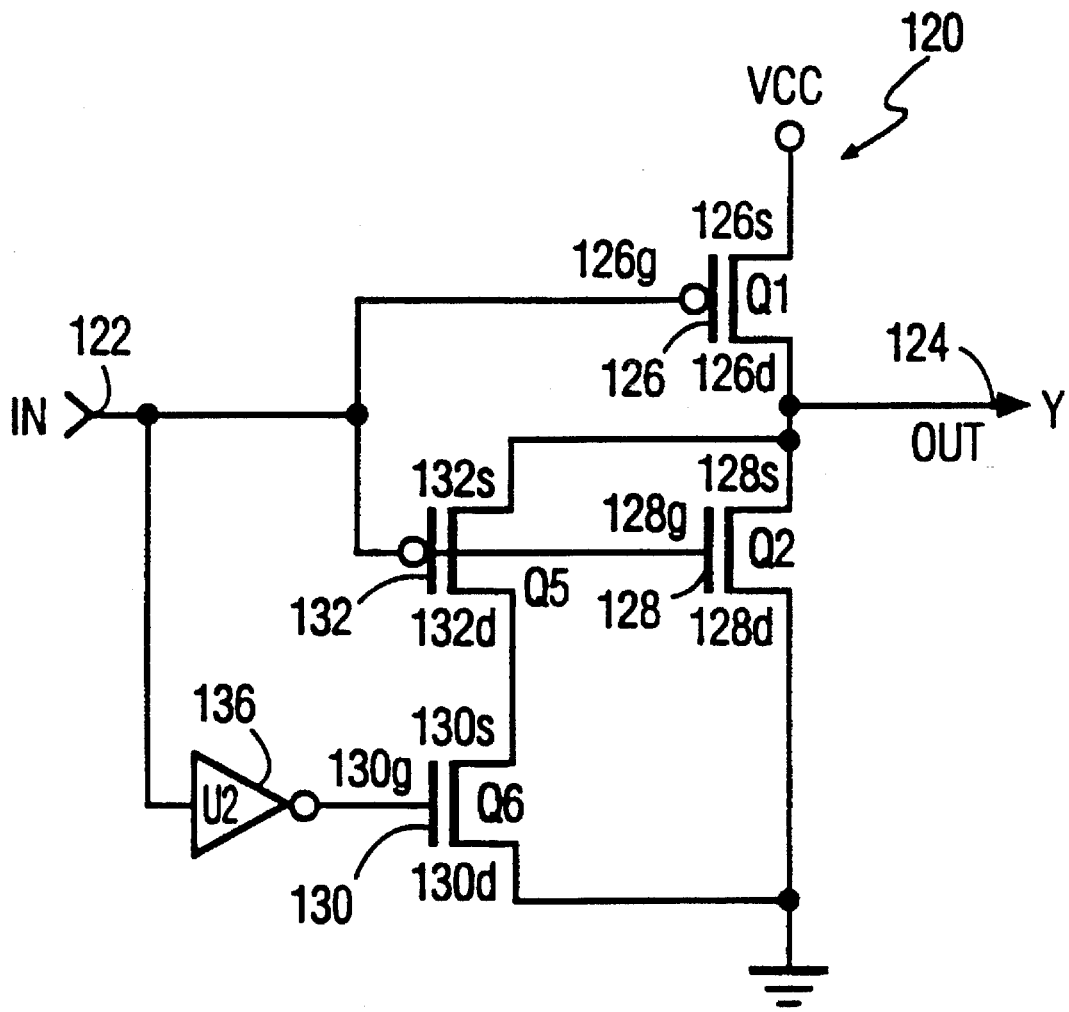
FIG. 3 is a circuit diagram of a CMOS inverter in accordance with a second embodiment of the present invention.

Reference is now had to FIG. 3 which illustrates an inverter 120 constructed in accordance with a second embodiment of the invention wherein the effective input threshold is compensated for during a fast low-to-high input signal transition affected. Inverter 120 is operable in the range from a voltage supply Vcc to ground and has an input terminal 122 and an output terminal 124. Inverter 120 includes a pMOS transistor 126 and a first nMOS transistor 128. PMOS transistor 126 has a gate 126g coupled to input terminal 122, a source 126s coupled to Vcc and a drain 126d. NMOS transistor 128 has a gate 128g coupled to gate 126g, a source 126s coupled to drain 126d and a drain 128d coupled to ground.

Inverter 120 also includes a second nMOS transistor 130 and a third nMOS transistor 132. Second nMOS transistor 132 has a source 132s coupled to output terminal 124, a drain 132d and a gate 132g. Third nMOS transistor 130 has a source 132s coupled to drain 132d, a drain 130d coupled to ground and a gate 130g. A further inverter 136 having its input coupled to input terminal 122 and its output coupled to gate 132g is also included in inverter 120.

Transistors 126 and 128 should preferably be sized so that when forming a standard inverter 129 (consisting of transistors 126 and 128 without transistors 130 and 132 and further inverter 136) the low-to-high input threshold is approximately forty (60) percent of Vcc. The low-to-high threshold of further inverter 136 should preferably be set to approximately sixty (40) percent of Vcc.

Circuit operation will be explained in accordance with the following example. Assume the input is specified to switch between 0 to 2.7 volts and Vcc is in the range of 2.7 to 3.6 volts. If Vcc equals 2.7 volts, the input thresholds of standard inverter 129 and further inverter 136 are approximately 1.6 and 1.1 volts, respectively. Prior to a low-to-high transition, further inverter 136 holds gate 130g high, turning on transistor 130. Transistors 128 and 132 are off and transistor 126 is on, holding output terminal 124 to Vcc.

As the input voltage ramps up, transistors 128 and 132 begin to turn on and transistor 126 begins to turn off. The effective input threshold of inverter 120 is now a combination of the effects of transistors 128 and 132 and is approximately 1.4 volts. When the input voltage reaches 1.1 volts, further inverter begins to switch, turning transistor 130 off. When transistor 130 is off, transistor 132 no longer contributes to the effective input threshold so that the threshold returns to 1.1 volts. However, since there is a propagation delay through further inverter 136, transistor 130 does not turn off instantly and therefore if the input edge rate is fast enough so that the input voltage passes through 1.4 volts before transistor 130 has started to turn off, the voltage at output terminal 124 will begin to switch. As further inverter 136 turns transistor 130 off, the input voltage is continuing to rise above the 1.6, the input threshold of standard transistor 129 so that the voltage at output terminal will continue to switch. As can be seen by the above example, for a fast low-to-high input transition, the effective input threshold of inverter 120 would be approximately 1.4 volts.

If we now assume that Vcc equals 3.6 volts, the input thresholds of standard inverter 129 and further inverter 136 would be 2.2 and 1.4 volts respectively. If the same input signal is applied to inverter 120, further inverter 136 would begin to switch sooner relative to the voltage at output terminal 124 since the difference between the input thresholds increases as Vcc increases. Therefore, the contribution from transistor 132 to the effective low-to-high input threshold of inverter 120 would be significantly less because transistor 130 would turn off sooner. As a result, the effective low-to-high input threshold of inverter 120 would be approximately 1.5 volts. Thus, this embodiment of the invention creates a dynamic input threshold for inverter 120 which varies by only 0.1 volts over a Vcc range of 0.9 volts.

The embodiment of FIG. 3 does not affect a high-to-low input signal transition. As the input voltage decreases, the voltage passes through the input threshold of standard inverter 29 before further inverter 136 turns on transistor 130. Therefore, transistors 130 and 132 do not affect the input threshold of inverter 20.

It will thus be seen that the objects set forth above among those made apparent from the preceding description, are efficiently attained and, since certain changes may be made in the above constructions without departing from the spirit and scope of the invention, it is intended that all matter contained in the above description or shown in the accompanying drawings shall be interpreted as illustrative and not in a limiting sense.

It is also to be understood that the following claims are intended to cover all of the generic and specific features of the invention herein described and all statements of the scope of the invention which, as a matter of language, might be said to fall therebetween.

What is claimed is:

1. An inverter circuit coupled between a first voltage supply and a second voltage supply, comprising:

a first inverter having an input terminal and an output terminal and including a first transistor having a control electrode, a first flow electrode and a second flow electrode and a second transistor having a control electrode, a first flow electrode and a second flow electrode, said first flow electrode of said first transistor coupled to said first voltage supply, said second flow electrode of said first transistor and said first flow electrode of said second transistor coupled to said output terminal, said second flow electrode of said second transistor coupled to said second voltage supply, said both control electrodes coupled to said input terminal, said first inverter having a predetermined switching threshold;

current boosting means for increasing current between said first voltage supply and said output terminal, said current boosting means having a first input, a second input coupled to said input terminal and a main current path coupled between said first voltage supply and said output terminal; and a second inverter having an input coupled to said input terminal and an output coupled to said first input of said current boosting means, said second inverter having a switching threshold greater than said switching threshold of said first inverter.

2. The inverter as claimed in claim 1, wherein said means for boosting current includes a third transistor and a fourth transistor, said third transistor having a control electrode coupled to said output of said second inverter, a first flow electrode coupled to said first supply voltage and a second flow electrode, said fourth transistor having a control electrode coupled to said input terminal, a first flow electrode coupled to said second flow electrode of said third transistor and second flow electrode coupled to said output terminal.

3. The inverter as claimed in claim 2, wherein said first, second third and fourth transistors are pMOS transistors and wherein said second transistor is an nMOS transistor.

4. The inverter as claimed in claim 3, wherein said first voltage supply ranges in value from about 2.7 volts to 3.6 volts.

5. An inverter circuit coupled between a first voltage supply and a second voltage supply, comprising:

a first inverter having an input terminal and an output terminal and including a first transistor having a control electrode, a first flow electrode and a second flow electrode and a second transistor having a control electrode, a first flow electrode and a second flow electrode, said first flow electrode of said first transistor coupled to said first voltage supply, said second flow electrode of said first transistor and said first flow electrode of said second transistor coupled to said output terminal, said second flow electrode of said second transistor coupled to said second voltage supply, said both control electrodes coupled to said input terminal, said first inverter having a predetermined switching threshold;

current boosting means for increasing current between said second voltage supply and said output terminal, said current boosting means having a first input, a second input coupled to said input terminal and a main current path coupled between said second voltage supply and said output terminal; and a second inverter having an input coupled to said input terminal and an output coupled to said first input of said current boosting means, said second inverter having a switching threshold less than said switching threshold of said first inverter.

6. The inverter as claimed in claim 4, wherein said means for boosting current includes a third transistor and a fourth transistor, said third transistor having a control electrode coupled to said output of said second inverter, a first flow electrode coupled to said second voltage supply and a second flow electrode, said fourth transistor having a control electrode coupled to said input terminal, a first flow electrode coupled to said second flow electrode of said third transistor and a second flow electrode coupled to said output terminal.

7. The inverter as claimed in claim 4, wherein said first, second, third and fourth transistors are nMOS transistors and wherein said second transistor is a pMOS transistor.

8. A circuit including a logic gate having a predetermined threshold, said logic gate comprising:

an input terminal for receiving an input signal;

a first supply node and a second supply node for connection to first and second supply voltage sources;

first current path means between the first supply node and the output terminal for charging the output terminal in response to the input signal;

second current path means between the output terminal and the second supply node for discharging the output terminal in response to the input signal;

a further current path having first and second switches coupled in parallel to one of the first current path means and the second current path means;

first control means responsive to the input signal for turning on the second switch when the first current path means is active; and second control means responsive to the input signal for turning on the first switch at a time independent of said second switch.

* * * * *